(12) United States Patent
Park

(10) Patent No.: US 10,916,695 B2
(45) Date of Patent: Feb. 9, 2021

(54) ELECTRONIC DEVICE AND METHOD FOR FABRICATING THE SAME

(71) Applicant: SK hynix Inc., Icheon-Si (KR)

(72) Inventor: Jin-Won Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/293,116

(22) Filed: Mar. 5, 2019

(65) Prior Publication Data

US 2019/0198753 A1    Jun. 27, 2019

Related U.S. Application Data

(63) Continuation of application No. 15/469,266, filed on Mar. 24, 2017, now Pat. No. 10,249,815.

(30) Foreign Application Priority Data

Aug. 8, 2016 (KR) .................. 10-2016-0100850

(51) Int. Cl.
| | |
|---|---|
| *H01L 43/08* | (2006.01) |
| *H01L 27/22* | (2006.01) |
| *G06F 3/06* | (2006.01) |
| *G11C 11/16* | (2006.01) |
| *H01L 43/02* | (2006.01) |
| *H01L 43/12* | (2006.01) |
| *G11C 13/00* | (2006.01) |

(52) U.S. Cl.
CPC ............ *H01L 43/08* (2013.01); *G06F 3/0604* (2013.01); *G06F 3/0658* (2013.01); *G06F 3/0673* (2013.01); *G11C 11/161* (2013.01); *H01L 27/226* (2013.01); *H01L 27/228* (2013.01); *H01L 43/02* (2013.01); *H01L 43/12* (2013.01); *G11C 13/0002* (2013.01); *G11C 2213/52* (2013.01)

(58) Field of Classification Search
CPC ....... H01L 43/08; H01L 43/02; H01L 27/226; H01L 43/12
See application file for complete search history.

(56) References Cited

U.S. PATENT DOCUMENTS

| | | | |
|---|---|---|---|
| 7,948,044 B2 | 5/2011 | Horng et al. | |
| 8,508,984 B2 | 8/2013 | Ranjan et al. | |
| 9,013,045 B2* | 4/2015 | Satoh | ............. H01L 45/04 |
| | | | 257/295 |
| 9,159,767 B2 | 10/2015 | Park | |
| 9,588,890 B2 | 3/2017 | Kim | |
| 2003/0180968 A1 | 9/2003 | Nallan et al. | |
| 2008/0247226 A1* | 10/2008 | Liu | ............. H01L 27/2409 |
| | | | 365/163 |
| 2011/0089507 A1 | 4/2011 | Mao | |
| 2012/0322223 A1* | 12/2012 | Oh | ............. H01L 27/2409 |
| | | | 438/382 |

(Continued)

*Primary Examiner* — Dung A. Le
(74) *Attorney, Agent, or Firm* — Perkins Coie LLP

(57) ABSTRACT

Provided is an electronic device including a semiconductor memory. The semiconductor memory may include: a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug.

18 Claims, 15 Drawing Sheets

(56) References Cited

U.S. PATENT DOCUMENTS

| | | | |
|---|---|---|---|
| 2013/0032907 A1 | 2/2013 | Satoh et al. | |
| 2013/0119494 A1* | 5/2013 | Li | H01L 43/08 257/421 |
| 2014/0281231 A1* | 9/2014 | Lee | H01L 43/02 711/118 |
| 2015/0036031 A1 | 2/2015 | Kamimura | |
| 2016/0013405 A1 | 1/2016 | Kim | |
| 2016/0118578 A1* | 4/2016 | Park | H01L 43/12 438/3 |
| 2017/0018704 A1* | 1/2017 | Chuang | H01L 43/12 |
| 2017/0141125 A1 | 5/2017 | Tada | |
| 2017/0364306 A1 | 12/2017 | Kim | |
| 2018/0014800 A1* | 1/2018 | Jang | A61B 6/44 |
| 2018/0040670 A1 | 2/2018 | Glova | |
| 2018/0040814 A1 | 2/2018 | Park et al. | |

\* cited by examiner

ELECTRONIC DEVICE AND METHOD FOR FABRICATING THE SAME

CROSS-REFERENCE TO RELATED APPLICATIONS

This patent document is a continuation of U.S. patent application Ser. No. 15/469,266, entitled "ELECTRONIC DEVICE AND METHOD FOR FABRICATING THE SAME. INCLUDING VARIABLE RESISTANCE ELEMENT AND LOWER CONTACT PLUG WITH SIDEWALLS ALIGNED TO EACH OTHER" and filed on Mar. 24, 2017, which claims priority of Korean Patent Application No. 10-2016-0100850, entitled "ELECTRONIC DEVICE AND METHOD FOR FABRICATING THE SAME" and filed on Aug. 8, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving characteristics of a variable resistance element.

In an implementation, there is provided an electronic device including a semiconductor memory. The semiconductor memory may include: a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug.

Implementations of the above electronic device may include one or more the following.

A width of the variable resistance element increases from a top surface of the variable resistance element to a bottom surface of the variable resistance element. A sidewall of the variable resistance element is aligned with a sidewall of the lower contact plug. The variable resistance element includes an MTJ (Magnetic Tunnel Junction) structure which includes a free layer having a variable magnetization direction, a pinned layer having a pinned magnetization direction, and a tunnel barrier layer interposed between the free layer and the pinned layer. The variable resistance element further includes a lower electrode which is located below the MTJ structure and includes a conductive material different from the lower contact plug. The semiconductor memory further comprises: an upper contact plug coupled to the variable resistance element and disposed over the variable resistance element. A sidewall of the variable resistance element is not aligned with a sidewall of the upper contact plug. A width of the upper contact plug decreases from a top surface of the upper contact plug to a bottom surface of the upper contact plug. The semiconductor memory further comprises: a transistor; and a contact plug coupled to a first terminal of the transistor and having a width which decreases from a top surface of the contact plug to a bottom surface of the contact plug, and wherein the lower contact plug is coupled to a second terminal of the transistor. The lower contact plug has a top surface which is planarized, and the variable resistance element is located over the top surface of the lower contact plug. The semiconductor memory further comprises: a spacer pattern surrounding a sidewall of the variable resistance element. An outer sidewall of the spacer pattern is aligned with a sidewall of the lower contact plug. A width of a bottom surface of the variable resistance element is substantially the same as a width of a top surface of the lower contact plug. A width of a bottom surface of the variable resistance element is smaller than a width of a top surface of the lower contact plug.

In another implementation, there is provided an electronic device including a semiconductor memory. The semiconductor memory may include: a substrate including a source region and a drain region; stack structures formed over the substrate, each stack structure having a width increasing toward the substrate along a direction perpendicular to a surface of the substrate and including a variable resistance element having a resistance state depending on a voltage or current applied through the variable resistance element and a lower contact plug disposed under the variable resistance element and connecting the variable resistance element to the drain region; an upper contact plug formed over the stacked structure to connect the variable resistance element to a bit line; and a source line contact plug formed over the substrate and connecting the source region to a source line.

Implementations of the above electronic device may include one or more the following.

The source line contact plug has a width decreasing toward the substrate along a direction perpendicular to the surface of the substrate. An upper surface of the lower contact plug is planarized. A top surface of the lower contact plug has a width same as that of a lower surface of the variable resistance element. The variable resistance element of each stack structure has a sidewall covered by a spacer layer. The variable resistance element has a sidewall aligned with a sidewall of the lower contact plug.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory may include: forming a conductive layer over a substrate; forming a material layer over the conductive layer; forming a variable resistance element by selectively etching the material layer, the selective etching of the material layer causing portions of the conductive layer to be exposed; and forming a lower contact plug by etching the exposed conductive layer, the lower contact plug being coupled to the variable resistance element under the variable resistance element.

Implementations of the above method may include one or more the following.

The forming of the variable resistance element and the forming of the lower contact plug are performed by a physical etching process. A sidewall of the variable resistance element is aligned with a sidewall of the lower contact plug. The forming of the material layer comprises: forming a first layer that is either a free layer having a variable magnetization direction or a pinned layer having a pinned magnetization direction; forming a tunnel barrier layer over the first layer; and forming a second layer over the tunnel barrier layer, the second layer being either the free layer or the pinned layer and different from the first layer. The forming of the material layer further comprises: forming a lower electrode layer over the lower contact plug to include a conductive material different from the lower contact plug, before the forming of the first layer. After the forming of the lower contact plug, further comprising: forming an insulating layer covering the lower contact plug and the variable resistance element, the insulating layer disposed above the variable resistance element; selectively etching the insulating layer to form a hole exposing a top surface of the variable resistance element and having a width which decreases from a top surface to a bottom surface of the hole; and forming an upper contact plug by filling the hole with a conductive material. A sidewall of the variable resistance element is not aligned with a sidewall of the upper contact plug. After the forming of the lower contact plug, further comprising: forming an insulating layer covering the lower contact plug and the variable resistance element; selectively etching a portion of the insulating layer to form a hole exposing a portion of the substrate and having a width which decreases from a top surface to a bottom surface of the hole by, wherein the portion of the insulating layer does not overlap the lower contact plug and the variable resistance element; and forming a contact plug by filling the hole with a conductive material. After the forming of the variable resistance element, further comprising: forming a spacer pattern over a sidewall of the variable resistance element. The forming of the spacer pattern comprises: forming an insulating material along the variable resistance element and the conductive layer; and removing the insulating material which is located over the conductive layer. An outer sidewall of the spacer pattern is aligned with a sidewall of the lower contact plug. A width of the lower contact plug increases from a top surface of the lower contact plug to a bottom surface of the lower contact lug. A width of the variable resistance element increases from a top surface of the variable resistance element to a bottom surface of the variable resistance element.

These and other aspects, implementations and associated advantages are described in greater detail in the drawings, the description and the claims.

DETAILED DESCRIPTION

Figure 1A:
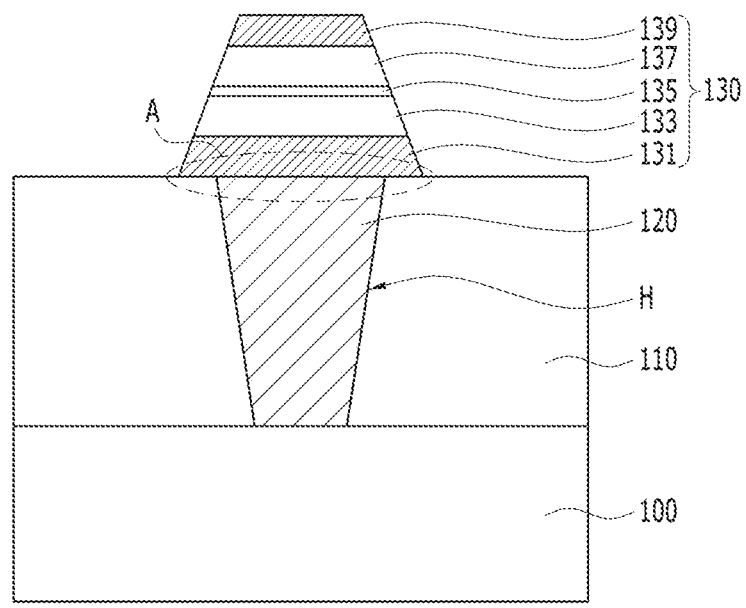
FIG. 1A is a cross-sectional view illustrating a semiconductor memory of a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing present implementations, a semiconductor memory of a comparative example and a problem thereof will be described.

Figure 1B:
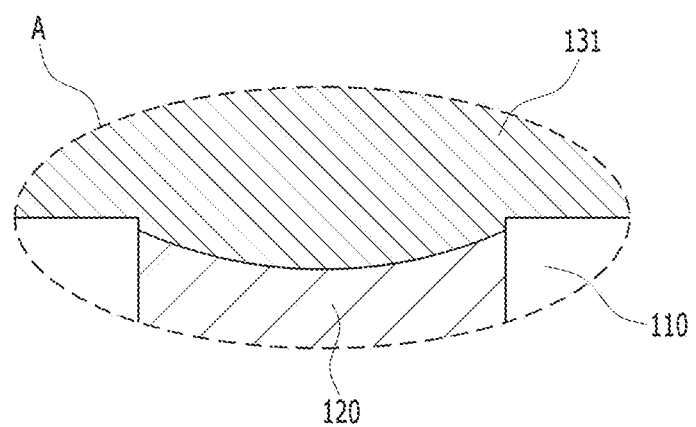
FIG. 1B is an enlarged view of 'A' portion of FIG. 1A.

FIG. 1A is a cross-sectional view illustrating a semiconductor memory of a comparative example, and FIG. 1B is an enlarged view of 'A' portion of FIG. 1A.

Referring to FIG. 1A, a semiconductor memory of a comparative example may include a substrate 100, a first interlayer insulating layer 110 formed over the substrate 100, a lower contact plug 120 penetrating through the first interlayer insulating layer 110 and coupled to a portion of the substrate 100, and a variable resistance element 130 located over the first interlayer insulating layer 110 and the lower contact plug 120 and coupled to the lower contact plug 120. The variable resistance element 130 exhibits different resistance states of different resistance values which can be used for storing data. Over the variable resistance element 130, an upper contact plug (not shown) coupled to the variable resistance element 130 may be located. The variable resistance element 130 may switch between different resistance states according to a voltage or current applied through the lower contact plug 120 and the upper contact plug, thereby storing different data.

Here, the variable resistance element 130 may be an element which can secure its characteristic in a case that the element is located over a planarized surface. For example, the variable resistance element 130 may include an MTJ (Magnetic Tunnel Junction) structure 133, 135 and 137 which is interposed between a lower electrode 131 and an upper electrode 139. The MTJ structure 133, 135 and 137 may include a free layer 133 having a variable magnetization direction, a pinned layer 137 having a pinned magnetization direction, and a tunnel barrier layer 135 interposed between the free layer 133 and the pinned layer 137 and allowing tunneling of electrons during a write operation which may change the resistance state of the variable resistance element 130. Such a MTJ structure exhibits different resistance states when the relative magnetization directions of the pinned layer and the free layer are different. When the variable resistance element 130 includes the MTJ structure 133, 135 and 137, it is required that the variable resistance element 130 be located over a planarized surface. For example, when the tunnel barrier layer 135 is not located over a planar surface and but located over an uneven or bent surface, characteristics of the variable resistance element 130 may be deteriorated due to this roughness, bending or unevenness of the underlying surface, e.g., by Neel Coupling.

Meanwhile, the lower contact plug 120 may be formed by forming a hole H by selectively etching the first interlayer insulating layer 110, forming a conductive material over the hole H, and performing a planarization process, for example, a CMP (Chemical Mechanical Polishing) process to the conductive material until a top surface of the first interlayer insulating layer 110 is exposed. However, during this planarization process, an undesired dishing phenomena may occur, in which a central portion of a top surface of the lower contact plug 120 is recessed as compared to an edge portion. Accordingly, a step height is generated at a boundary between the top surface of the lower contact plug 120 and the top surface of the first interlayer insulating layer 110 (see FIG. 1B). This creates the undesired surface unevenness in a surface on which the variable resistance element 130 is formed since the variable resistance element 130 is formed over the top surfaces of the lower contact plug 120 and the first interlayer insulating layer 110 that are not planarized. As a result, the characteristics of the variable resistance element 130 may be deteriorated.

In recognition of the problems above, the disclosed technology provide various implementations of a semiconductor memory and its fabricating method which can prevent the deterioration of the variable resistance element 130.

Figure 2A:
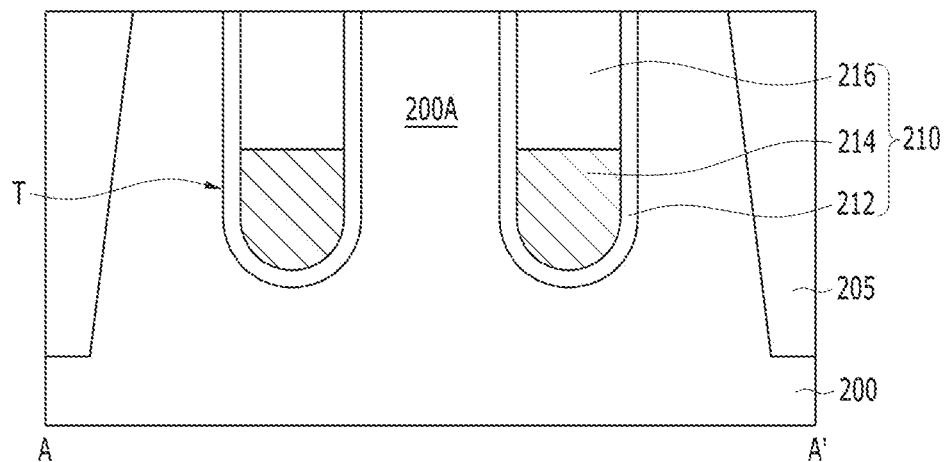
FIGS. 2A to 2G are cross-sectional views illustrating a semiconductor memory in accordance with an implementation and a method for fabricating the same.
Figure 2B:
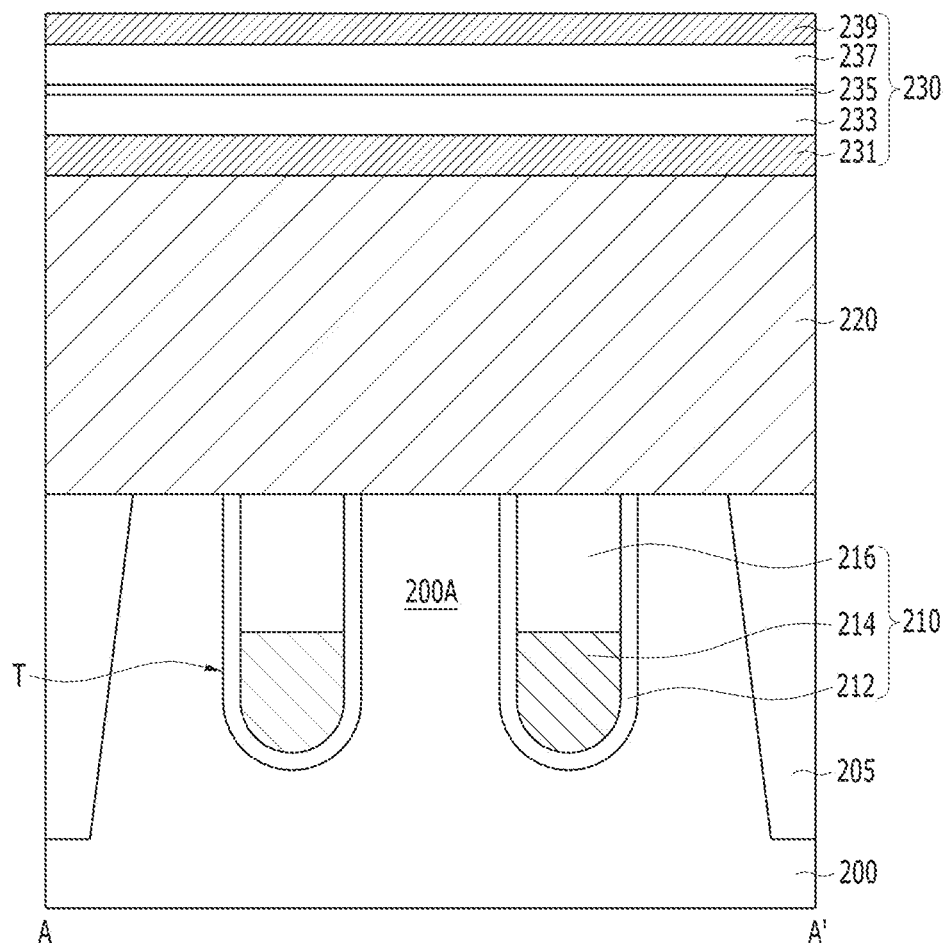
Figure 2C:
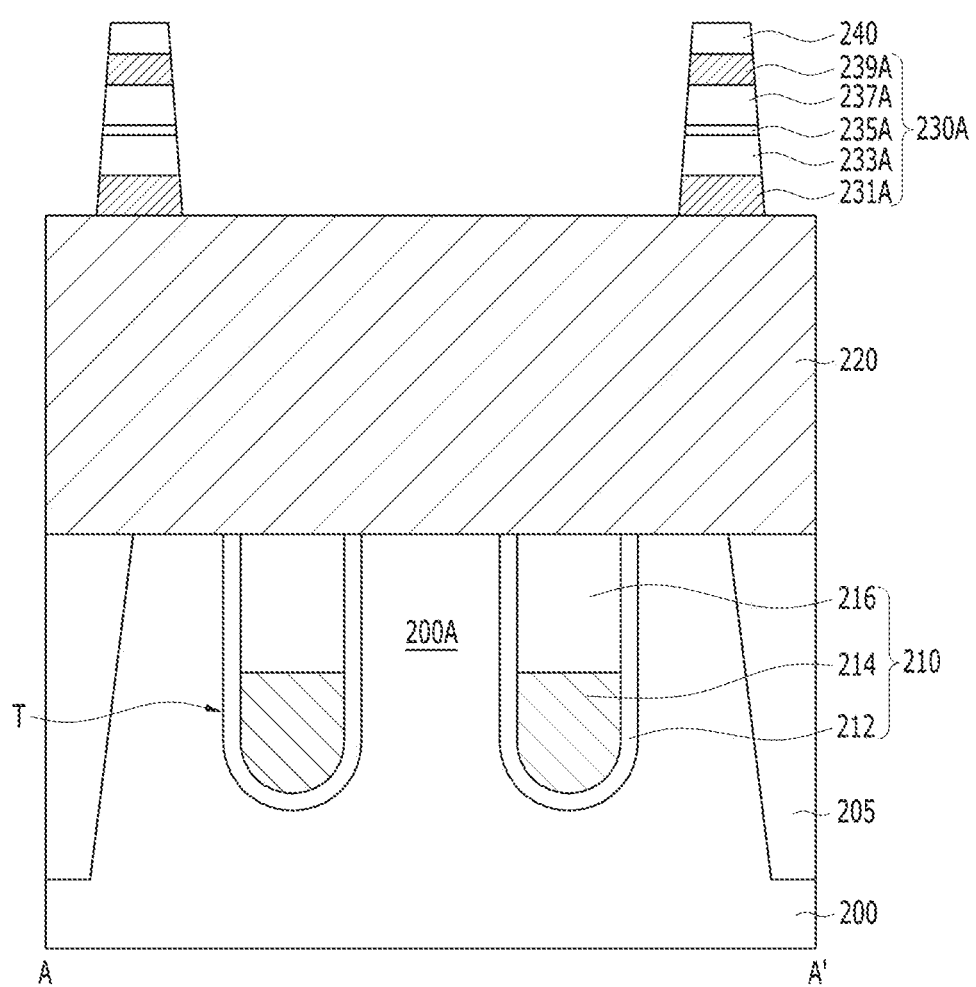
Figure 2D:
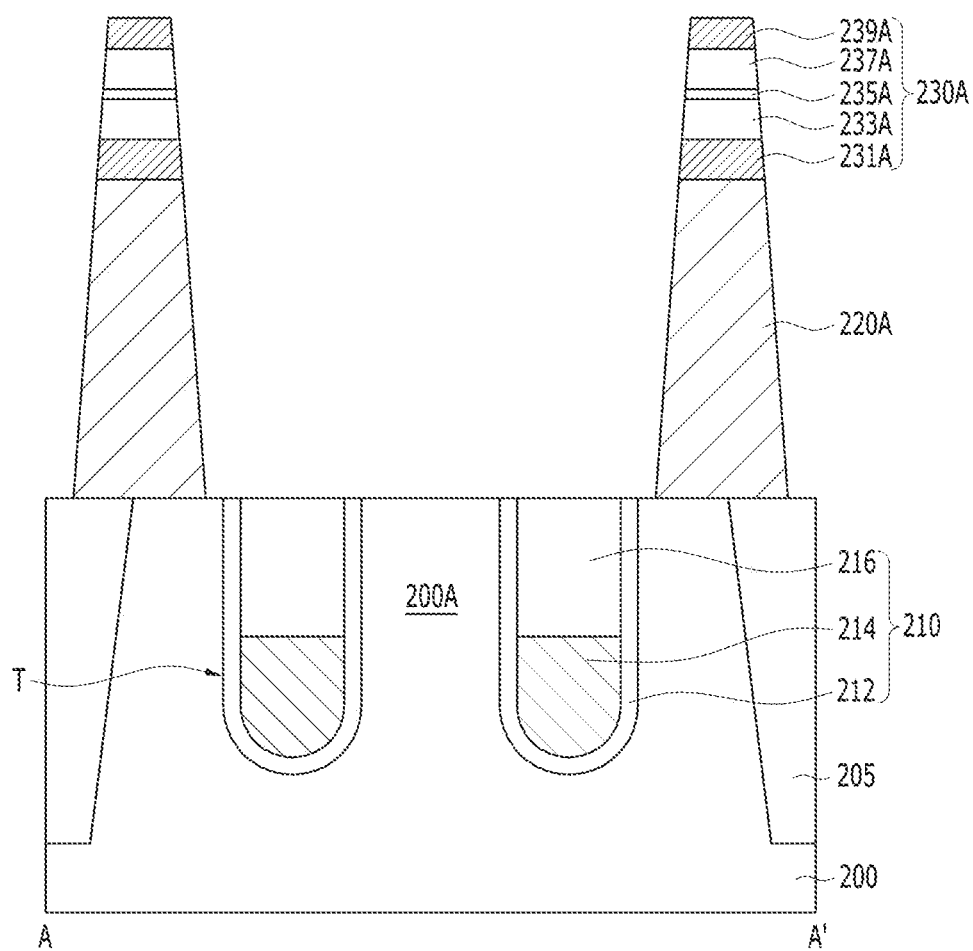
Figure 2E:
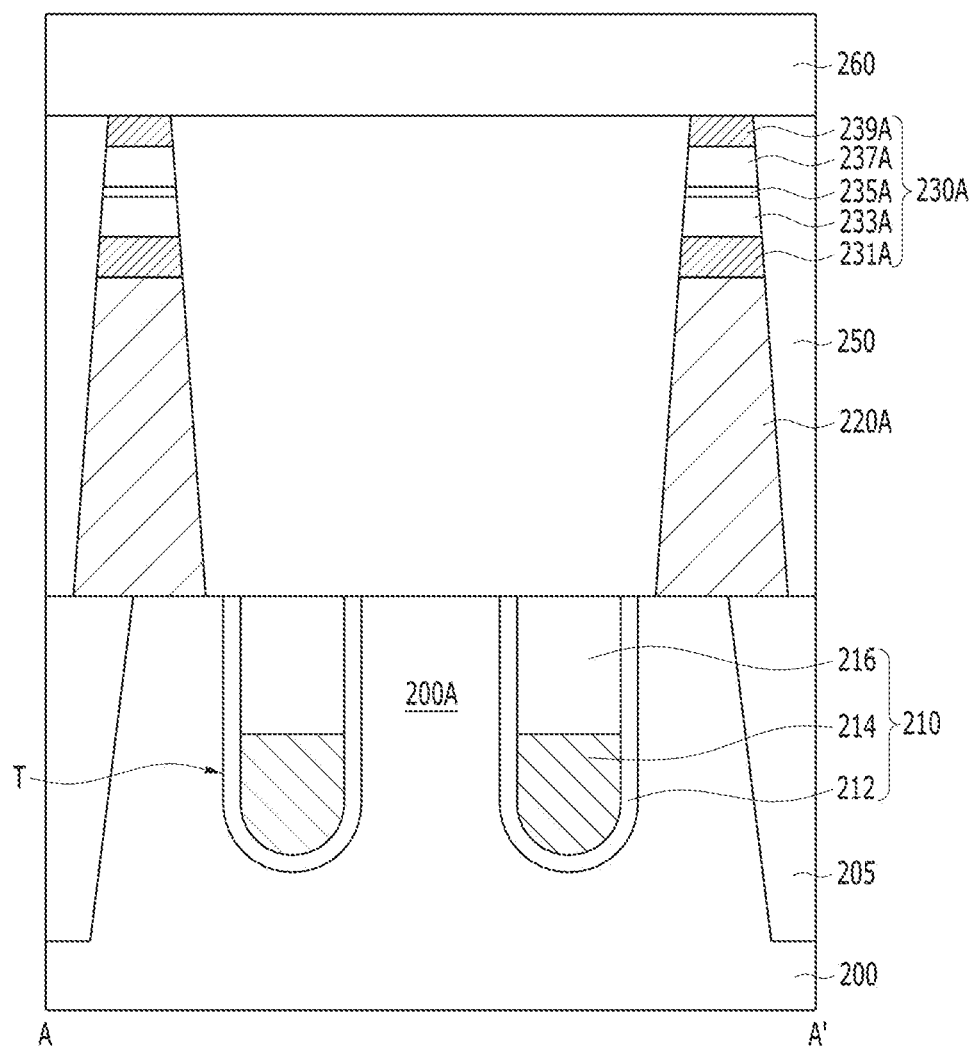
Figure 2F:
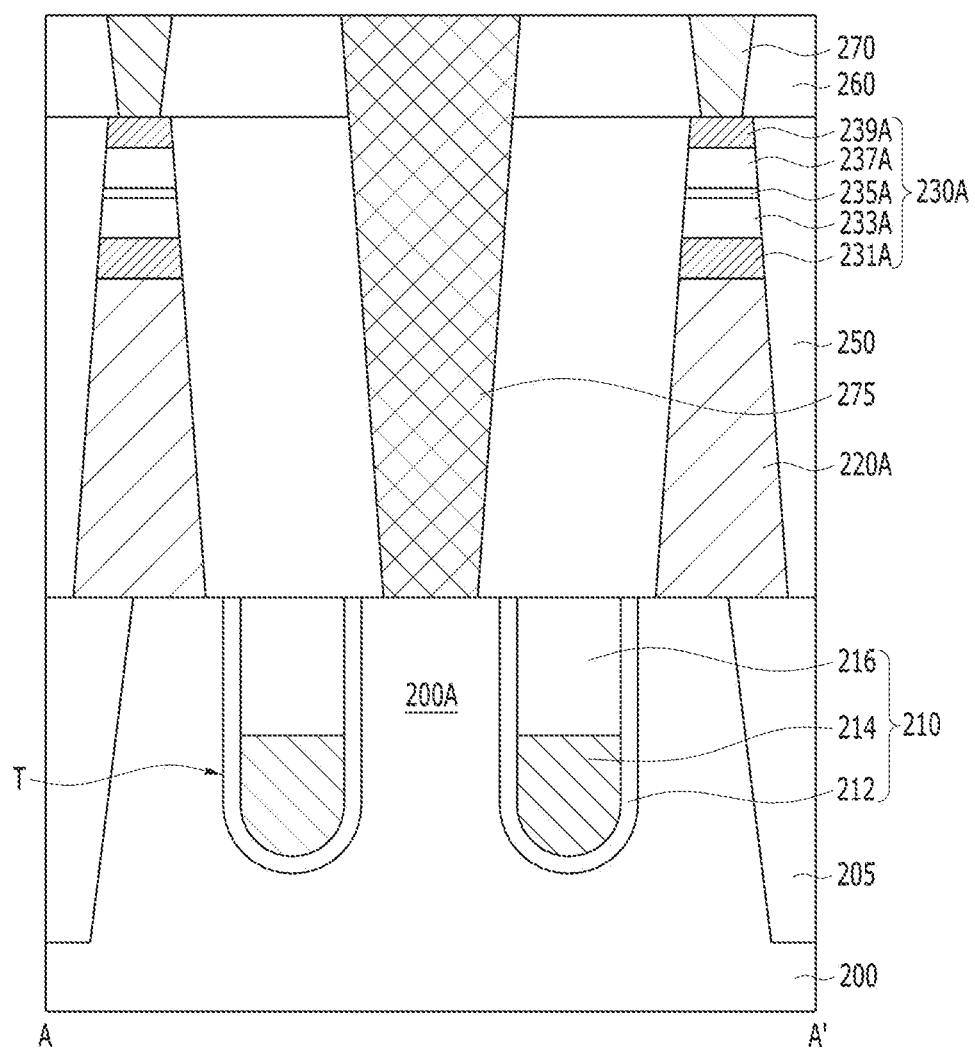
Figure 2G:
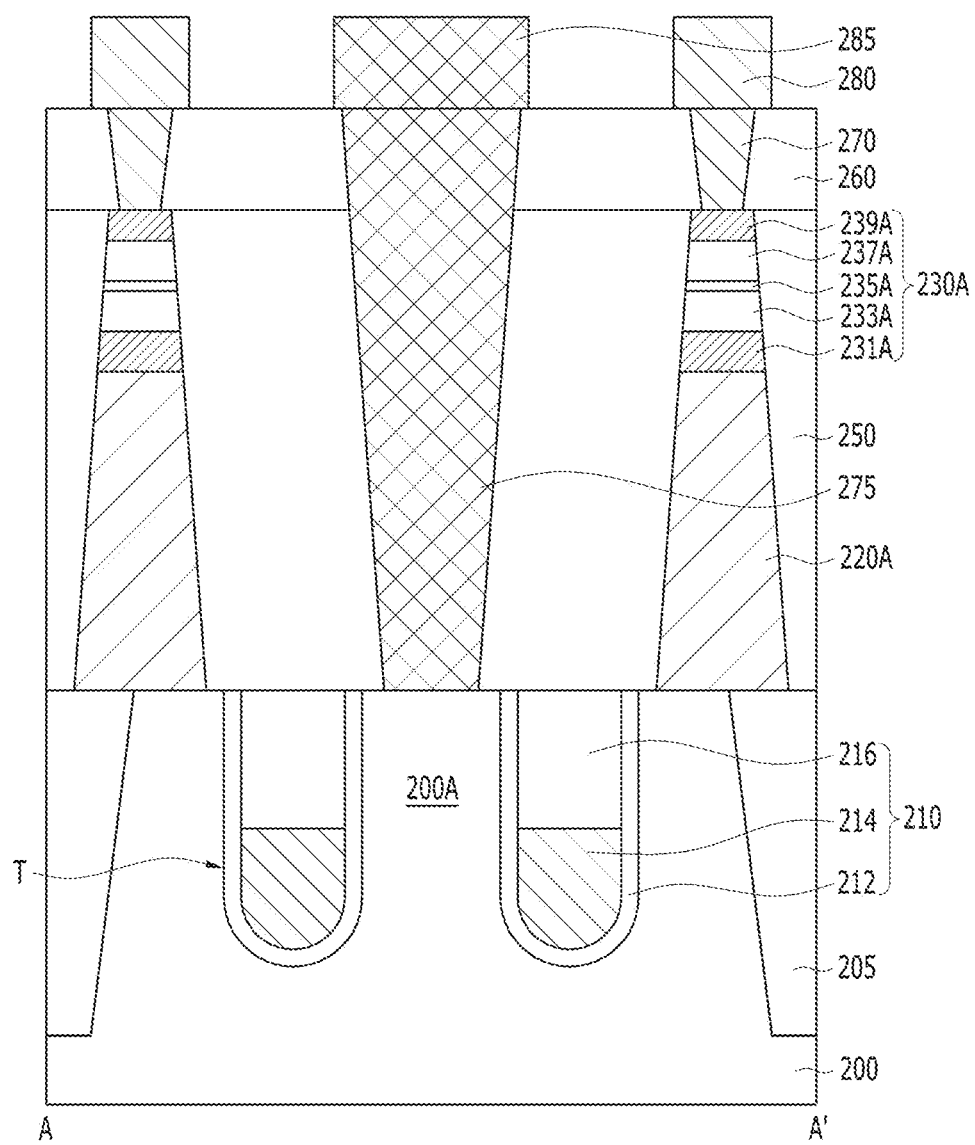
Figure 2H:
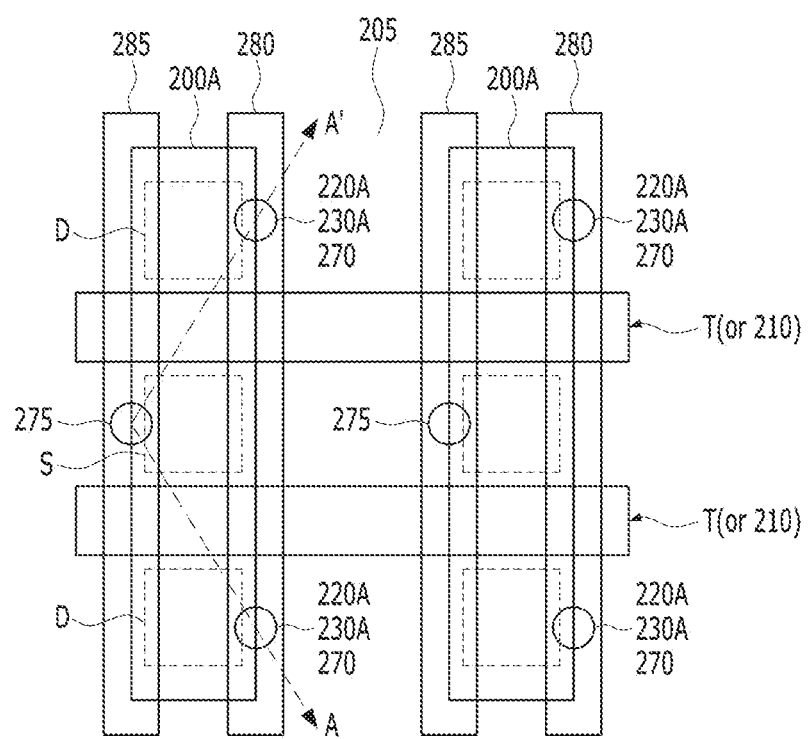
FIG. 2H is a planar view corresponding to the semiconductor memory of FIG. 2G.

FIGS. 2A to 2G are cross-sectional views illustrating a semiconductor memory in accordance with an implementation and a method for fabricating the same, and FIG. 2H is a planar view corresponding to the semiconductor memory of FIG. 2G. The cross-sectional views of FIGS. 2A to 2G are shown based on a line A-A' of FIG. 2H.

First, a fabricating method will be described. Although the fabricating method is mainly described according to the cross-sectional views, the planar view may be referred together with the cross-sectional views as necessary.

Referring to FIG. 2A, a semiconductor substrate 200 may be provided. The semiconductor substrate 200 may include a semiconductor material such as a silicon, etc.

Then, an active region 200A of the semiconductor substrate 200 may be defined by forming an isolation layer 205 in the semiconductor substrate 200. The isolation layer 205 may be formed by forming an isolation trench by selectively etching an isolation region of the semiconductor substrate 200 and filling the isolation trench with an insulating material such as a silicon oxide, or a silicon nitride, etc.

Referring together with FIG. 2H, in this implementation, a plurality of active regions 200A may be arranged to be separated from one another in a first direction, for example, in a width direction, and each of the active regions 200A may have a line shape which extends in a second direction crossing the first direction, for example, in a length direction. However, shapes, numbers and arrangements of the active regions 200A may be variously modified.

Then, a gate trench T may be formed by forming a mask pattern (not shown) exposing a gate forming region over the semiconductor substrate 200, and etching the active region 200A and the isolation layer 205 using the mask pattern as an etching barrier. The gate trench T may provide a space in which a gate of a transistor is to be formed.

Referring together with FIG. 2H, in this implementation, a plurality of gate trenches T may be arranged to be separated from one another in the second direction, and each of the gate trenches T may extend in the first direction to cross the active regions 200A. However, shapes, numbers and arrangements of the gate trenches T may be variously modified.

Then, a gate insulating layer 212 may be formed along an inner wall of the gate trench T. The gate insulating layer 212 may be formed by a thermal oxidation process or deposition process of an insulating material, and include a silicon oxide, etc.

Then, a gate electrode 214 may be formed to fill a lower portion of the gate trench T in which the gate insulating layer 212 is formed. The gate electrode 214 may be formed by forming a conductive material such as a metal, a metal nitride or others over a resultant structure in which the gate insulating layer 12 is formed, and performing an etch back process until the conductive material has a desired height.

Then, a gate protective layer 216 may be formed over the gate electrode 214. The gate protective layer 216 may be formed by forming an insulating material to cover a resultant structure in which the gate insulating layer 212 and the gate electrode 214 are formed, and performing a planarization process, for example, a CMP or etch back until a top surface of the semiconductor substrate 200 is exposed. The gate protective layer 216 may be formed of or include an insulating material such as a silicon nitride, a silicon oxynitride, or a combination thereof, etc.

As a result, a gate structure 210 which includes the gate insulating layer 212, the gate electrode 214 and the gate protective layer 216 may be formed.

Then, impurities may be implanted into the active regions 200A at both sides of the gate structure 210 to form junction regions. The junction region located at one side of the both sides of the gate structure 210 may serve as a source region S, and the junction region located at the other side of the both sides of the gate structure 210 may serve as a drain region D. Referring together with FIG. 2H, in this implementation, the source region S may be commonly located between two gate structures 210 and the drain region D may be located at each of both sides of the two gate structures 210. However, in another implementation, locations of the source region S and the drain region D may be reversed to each other.

As a result, a transistor including the gate structure 210, the source region S and the drain region D may be formed.

Referring to FIG. 2B, a conductive layer 220 for forming a lower contact plug may be formed over a resultant structure of FIG. 2A. The conductive layer 220 may be formed to cover a whole surface of the semiconductor substrate 200 in which the transistor is formed, and have a single-layered structure or multi-layered structure including a conductive material, for example, a metal such as W or Ta, or a metal nitride such as TiN, etc. Also, the conductive layer 220 may have a planarized top surface. To have the planarized top surface, after depositing the conductive layer 220, a planarization process may be further performed on a top surface of the conductive layer 220.

Then, a material layer 230 for forming a variable resistance element may be formed over the conductive layer 220. The material layer 230 may have a single-layered structure or multi-layered structure which shows a variable resistance characteristic by a combination of multilayers. The material layer 230 may be formed over the planarized top surface of the conductive layer 220.

In this implementation, the material layer 230 may have a multi-layered structure including an MTJ structure 233, 235 and 237. The MTJ structure 233, 235 and 237 may include a free layer 233 having a variable magnetization direction, a pinned layer 237 having a pinned magnetization direction, and a tunnel barrier layer 235 interposed between the free layer 233 and the pinned layer 237 and allowing tunneling of electrons during a write operation which changes the resistance state of the variable resistance element 230. The free layer 233 and the pinned layer 237 may have a single-layered structure or multi-layered structure which includes a ferromagnetic material, for example, Fe—Pt alloy, Fe—Pd alloy, Co—Pd alloy, Co—Pt alloy, Fe—Ni—Pt alloy, Co—Fe—Pt alloy, Co—Ni—Pt alloy, or Co—Fe—B alloy. Locations of the free layer 233 and the pinned layer 237 may be reversed to each other. The tunnel barrier layer 235 may have a single-layered structure or multi-layered structure which includes an oxide such as MgO, CaO, SrO, TiO, VO, or NbO, etc.

Furthermore, the material layer 230 may include a lower electrode layer 231 which is located under the MTJ structure 233, 235 and 237 and improves characteristics of the MTJ structure 233, 235 and 237 while coupling the lower contact plug and the variable resistance element to each other. Also, the material layer 230 may include an upper electrode layer 239 which is located over the MTJ structure 233, 235 and 237, improves the characteristics of the MTJ structure 233, 235 and 237 and facilitates fabricating processes while coupling the variable resistance element and an upper contact plug to each other. The lower electrode layer 231 and the upper electrode layer 239 may have a single-layered structure or multi-layered structure which includes a conductive material such as a metal, or a metal nitride, etc.

However, the material layer 230 for forming the variable resistance element is not limited to that described above. The material layer 230 may have a single-layered structure or multi-layered structure which switches between different resistance states according to an applied voltage or current. For example, the material layer 230 may have a single-layered structure or multi-layered structure which includes a material used in RRAM, PRAM, FRAM, MRAM or others, for example, a metal oxide such as a transition metal oxide or perovskite-based material, a phase-change material such as a chalcogenide-based material, a ferroelectric material, or a ferromagnetic material, etc. In various implementations, it is turned out that the material layer 230 can secure its characteristics when the material layer 230 is located over a planarized surface.

Referring to FIG. 2C, a hard mask pattern 240 for patterning the variable resistance element may be formed over the material layer 230. A whole or portion of the hard mask pattern 240 may be removed during subsequent processes such as a lower contact plug forming process. When at least a portion of the hard mask pattern 240 remains during the subsequent processes, the hard mask pattern 240 may include a conductive material such as a metal, a metal nitride or others for coupling the upper contact plug and the variable resistance element to each other.

Then, a variable resistance element 230A in which a lower electrode 231A, a free layer pattern 233A, a tunnel barrier layer pattern 235A, a pinned layer pattern 237A and an upper electrode 239A are stacked may be formed by etching the material layer 230 using the hard mask pattern 240 as an etching barrier. This etching process may be performed by a physical etching process, for example, an IBE (Ion Beam Etching), or an RIE (Reactive Ion Etching), etc. In this etching process, etching residues may be attached to an etched sidewall, so the variable resistance element 230A may have a width which increases from a top surface to a bottom surface of the variable resistance element. In this implementation, a portion of the hard mask pattern 240 may remain over the variable resistance element 230A.

Referring to FIG. 2D, a lower contact plug 220A may be formed by etching the conductive layer 220 exposed by the variable resistance element 230A.

Here, since the lower contact plug 220A is formed by an etching process using the variable resistance element 230A as an etching barrier, the lower contact plug 220A may have a sidewall which is aligned with a sidewall of the variable resistance element 230A.

This etching process may be performed by a physical etching process, for example, an IBE (Ion Beam Etching), an RIE (Reactive Ion Etching), etc. In this etching process, etching residues may be attached to an etched sidewall, so the lower contact plug 220A may have a width which increases from top to bottom.

In this implementation, a whole of the hard mask pattern 240 may be removed during this etching process. However, in other implementations, a portion of the hard mask pattern 240 may remain after this etching process.

As a result, a stack structure of the lower contact plug 220A and the variable resistance element 230A may be formed.

Referring together with FIG. 2H, the stack structure of the lower contact plug 220A and the variable resistance element 230A may be formed to be coupled to each of the drain regions D located at the both sides of the two gate structures 210.

Referring to FIG. 2E, a first interlayer insulating layer 250 may be formed to fill a space between two adjacent stack structures of the lower contact plug 220A and the variable resistance element 230A. In some implementations, the first interlayer insulating layer 250 is formed to cover sidewalls of the stack structures of the lower contract plug 220A and the variable resistance element 230A. The first interlayer insulating layer 250 may be formed by depositing an insulating material covering the stack structure of the lower contact plug 220A and the variable resistance element 230A, and performing a planarization process until a top surface of the variable resistance element 230A is exposed.

Then, a second interlayer insulating layer 260 may be formed over the first interlayer insulating layer 250.

Meanwhile, the first interlayer insulating layer 250 and the second interlayer insulating layer 260 may be formed in a single process. That is, an insulating material covering the stack structure of the lower contact plug 220A and the variable resistance element 230A may be deposited, and then, a planarization process to the insulating material may be performed to an upward position from the top surface of the variable resistance element 230A.

Referring to FIG. 2F, an upper contact plug 270 coupled to the variable resistance element 230A over the variable resistance element 230A may be formed by selectively etching the second interlayer insulating layer 260 to form a hole exposing the top surface of the variable resistance element 230A, and filling the hole with a conductive material. The upper contact plug 270 may be formed of or include a conductive material such as a metal, or a metal nitride, etc.

Here, etching residues may be attached to an etched sidewall during the etching process for forming the hole for the upper contact plug 270, and thus the hole may have a width which decreases from a top surface of the upper contact plug 270 to a bottom surface of the upper contact plug 270. Therefore, the upper contact plug 270 may have a width which decreases from the top surface to the bottom surface, unlike the variable resistance element 230A and the lower contact plug 220A.

Also, a source line contact plug 275 may be formed by selectively etching the second interlayer insulating layer 260 and the first interlayer insulating layer 250 to form a hole exposing a portion of the active region 200A, for example, the source region S, and filling the hole with a conductive material. The source line contact plug 275 may be a contact plug coupled to a source line which will be described later. The source line contact plug 275 may be formed of a conductive material such as a metal, a metal nitride, etc.

Here, etching residues may be attached to an etched sidewall during the etching process for forming the hole for the source line contact plug 275, and thus the hole may have a width which decreases from a top surface of the hole to a bottom surface of the hole. Therefore, the source line contact plug 275 may have a width which decreases from the top surface to the bottom surface of the source line contact plug 275, unlike the variable resistance element 230A and the lower contact plug 220A.

Referring to FIG. 2G, a bit line 280 and a source line 285 may be formed by depositing a conductive material such as a metal or metal nitride over a resultant structure of FIG. 2F, and patterning the conductive material. The bit line 280 may be coupled to the upper contact plug 270 while extending in a direction, for example, in the second direction. The source line 285 may be coupled to the source line contact plug 275 while extending in a direction, for example, in the second direction.

By the aforementioned processes, the semiconductor memory shown in FIGS. 2G and 2H may be formed.

Referring again to FIGS. 2G and 2H, the semiconductor memory according to the implementation may include the transistor including the gate structure 210, and the source region S and the drain region D located at the both sides of the gate structure 210, a stack structure coupled to the drain region D of the transistor and including the lower contact plug 220A, the variable resistance element 230A and the upper contact plug 270, the source line contact plug 275 coupled to the source region S of the transistor, the bit line 280 coupled to the upper contact plug 270 over the upper contact plug 270, and the source line 285 coupled to the source line contact plug 275 over the source line contact plug 275.

The variable resistance element 230A may switch between different resistance states according to a voltage or current applied through the lower contact plug 220A and the upper contact plug 270, thereby storing different data. When the variable resistance element 230A includes the MTJ structure and the magnetization direction of the free layer pattern 233A and the magnetization direction of the pinned layer pattern 237A are parallel to each other, the variable resistance element 230A may be in a low resistance state. On the other hand, when the magnetization direction of the free layer pattern 233A and the magnetization direction of the pinned layer pattern 237A are anti-parallel to each other, the variable resistance element 230A may be in a high resistance state. The magnetization direction of the free layer pattern 233A may be changed by Spin Transfer Torque.

Each of the lower contact plug 220A and the variable resistance element 230A may have a width which increases from its top surface to its bottom surface. On the other hand, each of the upper contact plug 270 and the source line contact plug 275 may have a width which decreases from its top surface to its bottom surface. Also, the sidewall of the lower contact plug 220A may be aligned with the sidewall of the variable resistance element 230A. In some implementations, the sidewall of the upper contact plug 270 may not be aligned with the sidewalls of the lower contact plug 220A and the variable resistance element 230A. A width of a top surface of the lower contact plug 220A may be substantially the same as a width of a bottom surface of the variable resistance element 230A.

The lower contact plug 220A may be or provide a transmission path of a voltage or current to the variable resistance element 230A, and be distinguished from the lower electrode 231A which is a part of the variable resistance element 230A. A bottom of the lower contact plug 220A may be directly coupled to the active region 200A of the semiconductor substrate 200 and/or the junction region. On the other hand, the lower electrode 231A of the variable resistance element 230A cannot be directly coupled to the active region 200A and/or the junction region of the semiconductor substrate 200 while being coupled to the active region 200A and/or the junction region through the lower contact plug 220A. Furthermore, the lower contact plug 220A may be formed of or include a material which has a relatively low resistance and is easily etched. In some implementations, the lower electrode 231A may be formed of or include a material which improves some characteristics of MTJ structure 233, 235 and 237, for example, a perpendicular anisotropy of the MTJ structure 233, 235 and 237. The lower contact plug 220A and the lower electrode 231A may include different conductive materials from each other.

By the aforementioned semiconductor memory and the fabricating method thereof, the variable resistance element 230A may be formed over the planarized top surface of the lower contact plug 220A. Specifically, since the lower contact plug 220A is formed by the patterning of the conductive layer 220 after the forming of the variable resistance element 230A, a dishing phenomenon may not occur at the top surface of the lower contact plug 220A. Also, since the first interlayer insulating layer 250 is formed to fill a space between the stack structures of the lower contact plug 220A and the variable resistance element 230A after the forming of the lower contact plug 220A and the variable resistance element 230A, a step height at a boundary between the lower contact plug 220A and the first interlayer insulating layer 250 may not exist. As a result, the characteristics of the variable resistance element 230A can be secured.

Meanwhile, in the above implementation, when the hard mask pattern 240 is fully removed during the etching process of the conductive layer 220, the variable resistance element 230A may be damaged or attacked. For preventing this, a layer to protect the variable resistance element 230A may be further formed. This will be described below with reference to FIGS. 3A to 3C.

Figure 3A:
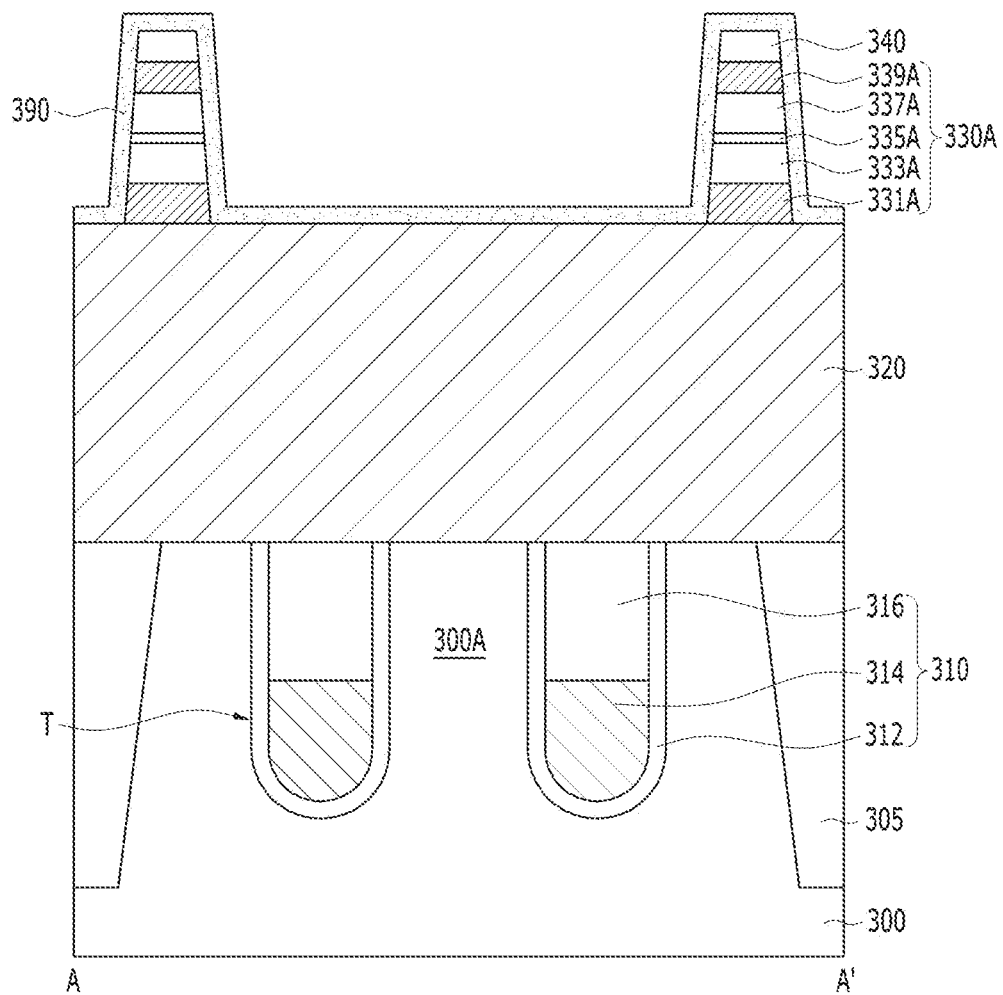
FIGS. 3A to 3C are cross-sectional views illustrating a semiconductor memory in accordance with another implementation and a method for fabricating the same.
Figure 3B:
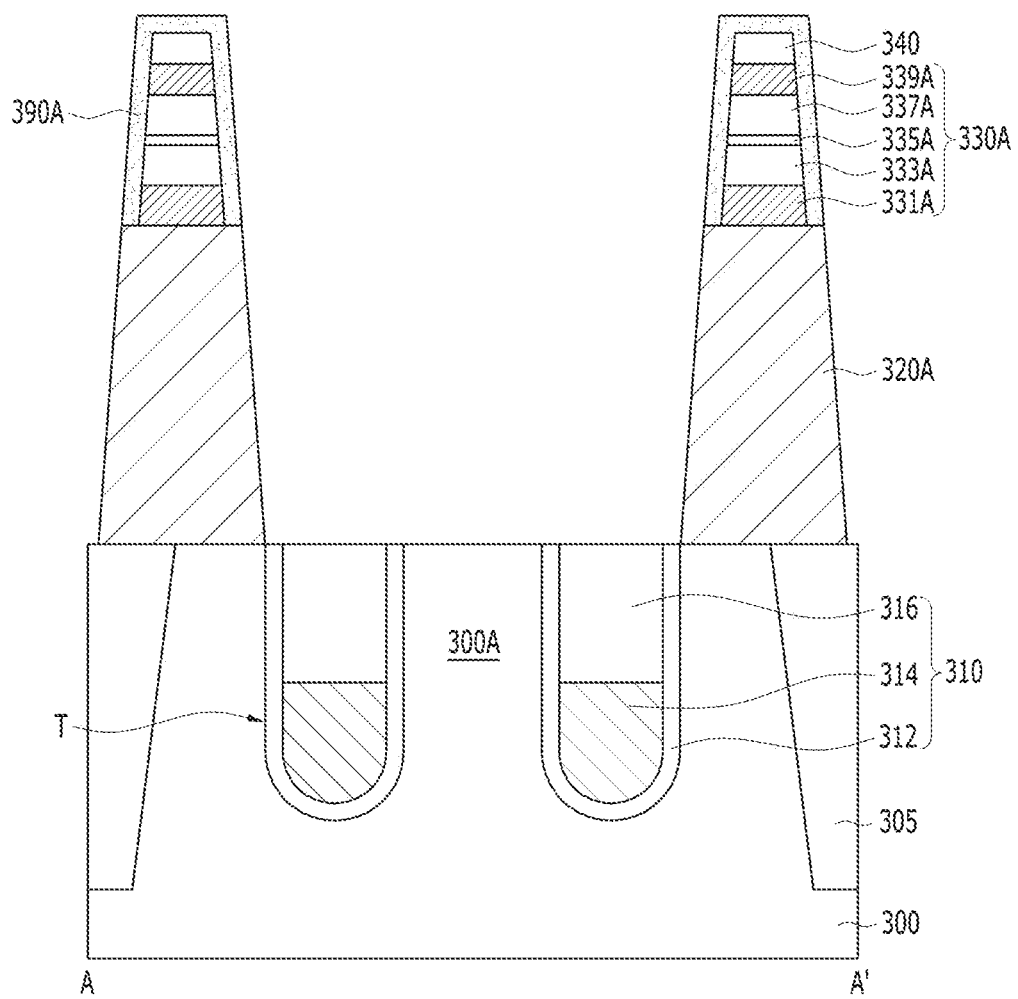
Figure 3C:
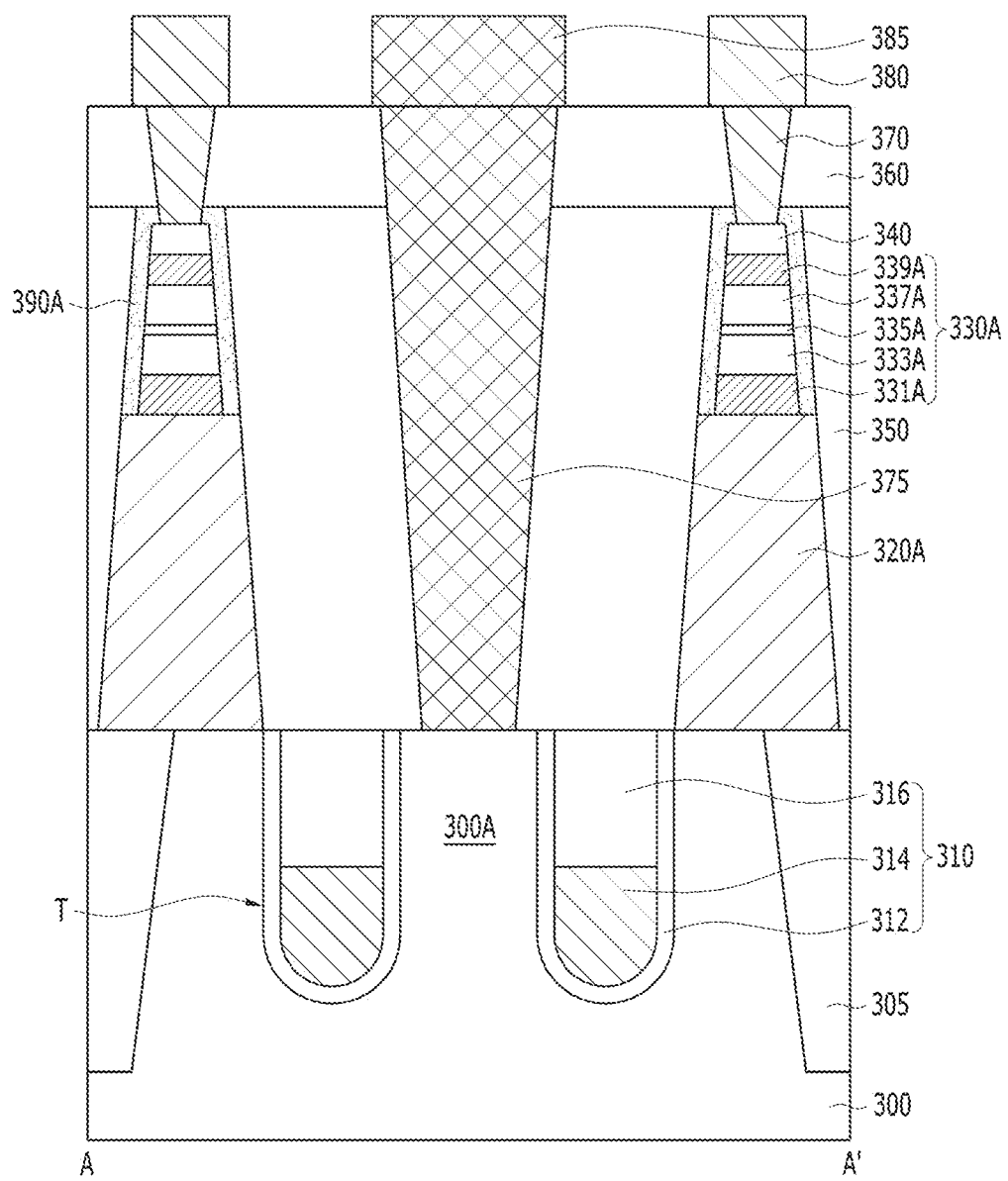

FIGS. 3A to 3C are cross-sectional views illustrating a semiconductor memory in accordance with another implementation and a method for fabricating the same. Differences from the above implementation will be mainly described.

Referring to FIG. 3A, an isolation layer 305 may be formed in a semiconductor substrate 300 to define an active region 300A of the semiconductor substrate 300, and then, a gate structure 310 which includes a gate insulating layer 312, a gate electrode 314 and a gate protective layer 316 may be formed in the semiconductor substrate 300. Junction regions may be formed in the active region 300A at both sides of the gate structure 310.

Then, a conductive layer 320 for forming a lower contact plug may be formed over the semiconductor substrate 300.

Then, a variable resistance element 330A in which a lower electrode 331A, a free layer pattern 333A, a tunnel barrier layer pattern 335A, a pinned layer pattern 337A and an upper electrode 339A are stacked may be formed by depositing a material layer for the variable resistance element 330A over the conductive layer 320, and etching the material layer using a hard mask pattern 340. In this etching process, a portion of the hard mask pattern 340 may remain. However, in other implementations, the hard mask pattern 340 may be removed.

Then, a spacer layer 390 may be formed along a whole surface of a resultant structure including the variable resistance element 330A and the hard mask pattern 340. The spacer layer 390 may protect the variable resistance element 330A and serve as an etching barrier during a subsequent etching process of the conductive layer 320. The spacer layer 390 may include an insulating material such as a silicon nitride, a silicon oxynitride, or a combination thereof, etc.

Referring to FIG. 3B, a spacer pattern 390A surrounding a sidewall of the variable resistance element 330A, and a sidewall and a top surface of the hard mask pattern 340 may be formed by removing a portion of the spacer layer 390 located over the conductive layer 320.

The spacer pattern 390A may be formed by performing a blanket etching process on the spacer layer 390. In this implementation, the spacer pattern 390A may be located over the top surface of the hard mask pattern 340. However, depending on fabricating processes, the spacer pattern 390A may be only located over the sidewall of the variable resistance element 330A and/or the sidewall of the hard mask pattern 340.

Then, a lower contact plug 320A may be formed by etching the conductive layer 320 using the spacer pattern 390A as an etching barrier. As a result, the lower contact plug 320A may have a sidewall which is aligned with an outer sidewall of the spacer pattern 390A and a width which increases from a top surface to a bottom surface of the lower contact plug 320A. Also, a width of a top surface of the lower contact plug 320A may be greater than a width of a bottom surface of the variable resistance element 330A.

Referring to FIG. 3C, a first interlayer insulating layer 350 filling a space between stack structures including the lower contact plug 320A, the variable resistance element 330A and the spacer pattern 390A may be formed, and then, a second interlayer insulating layer 360 may be formed over the first interlayer insulating layer 350. In some implementations, the first interlayer insulating layer 350 may be formed on sides of the stacked structure including the lower contact plug 320A, the variable resistance element 330A, and the spacer pattern 390A.

Then, an upper contact plug 370 located over the variable resistance element 330A and coupled to the variable resistance element 330A through the hard mask pattern 340 which is conductive may be formed. The upper contact plug 370 may be formed by forming a hole exposing a top surface of the hard mask pattern 340 and filling the hole with a conductive material. The hole may be formed by selectively etching the second interlayer insulating layer 360 and removing the spacer pattern 390A exposed by the etching of the second interlayer insulating layer 360. Unlike this implementation, in some implementations, a top surface of the variable resistance element 330A may be exposed by removing the hard mask pattern 340 during the forming process of the hole, so the upper contact plug 370 may be directly coupled to the variable resistance element 330A.

Also, a source line contact plug 375 may be formed by selectively etching the second interlayer insulating layer 360 and the first interlayer insulating layer 350 to form a hole exposing a portion of the active region 300A, for example, the source region S, and filling the hole with a conductive material.

Then, a bit line 380 coupled to the upper contact plug 370 and a source line 385 coupled to the source line contact plug 375 may be formed over the second interlayer insulating layer 360.

By the semiconductor memory of this implementation and the fabricating method thereof, since the variable resistance element 330A is formed over a planarized surface, characteristics of the variable resistance element 330A may be secured. Furthermore, since the spacer layer 390 protecting the variable resistance element 330A during etching processes is further formed, an attack or damage to the variable resistance element 330A may be prevented.

The above and other memory circuits or semiconductor devices based on the disclosed technology can be used in a range of devices or systems. FIGS. 4-8 provide some examples of devices or systems that can implement the memory circuits disclosed herein.

Figure 4:
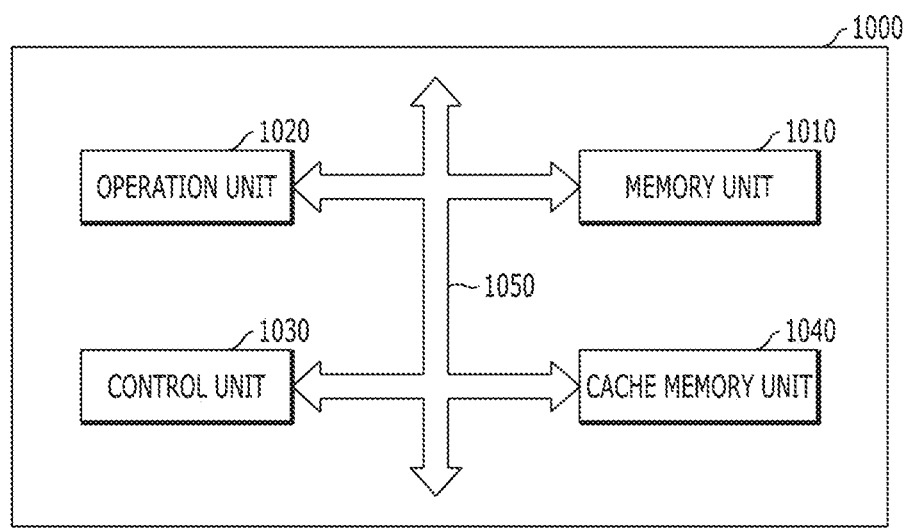
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or others. The memory unit 1010 may include a data register, an address register, a floating point register and so on. Besides, the memory unit 1010 may include various registers. The memory unit 1010 may perform the function of temporarily storing data for which operations are to be performed by operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
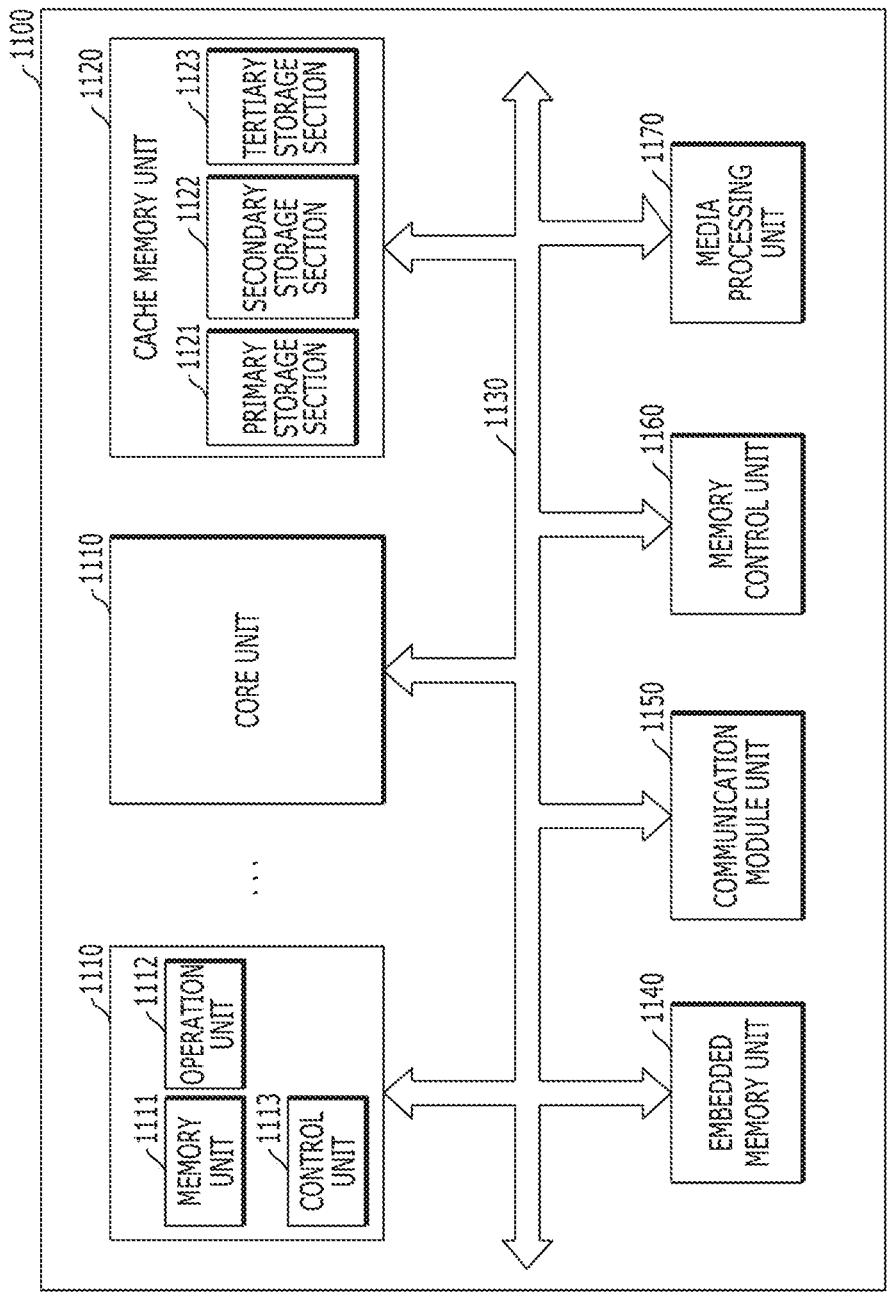
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
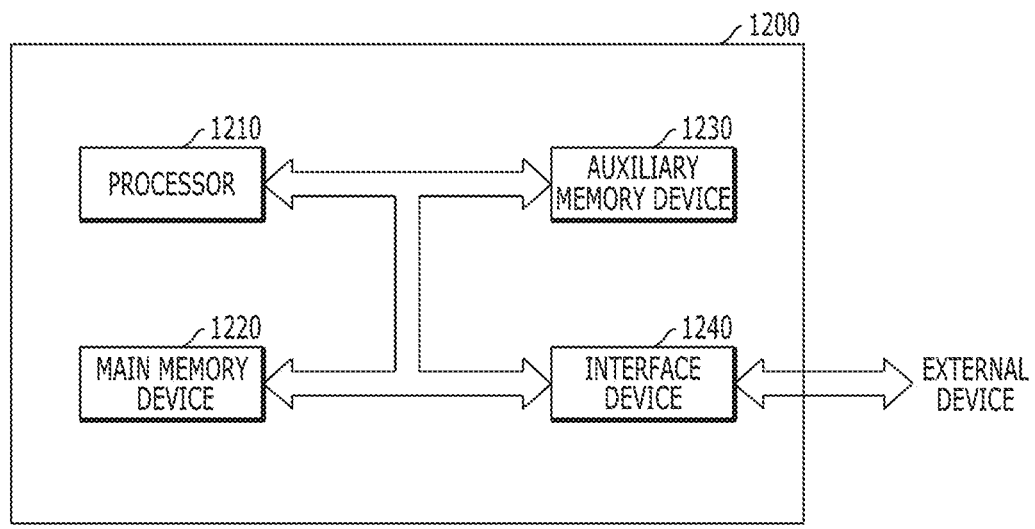
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module my include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
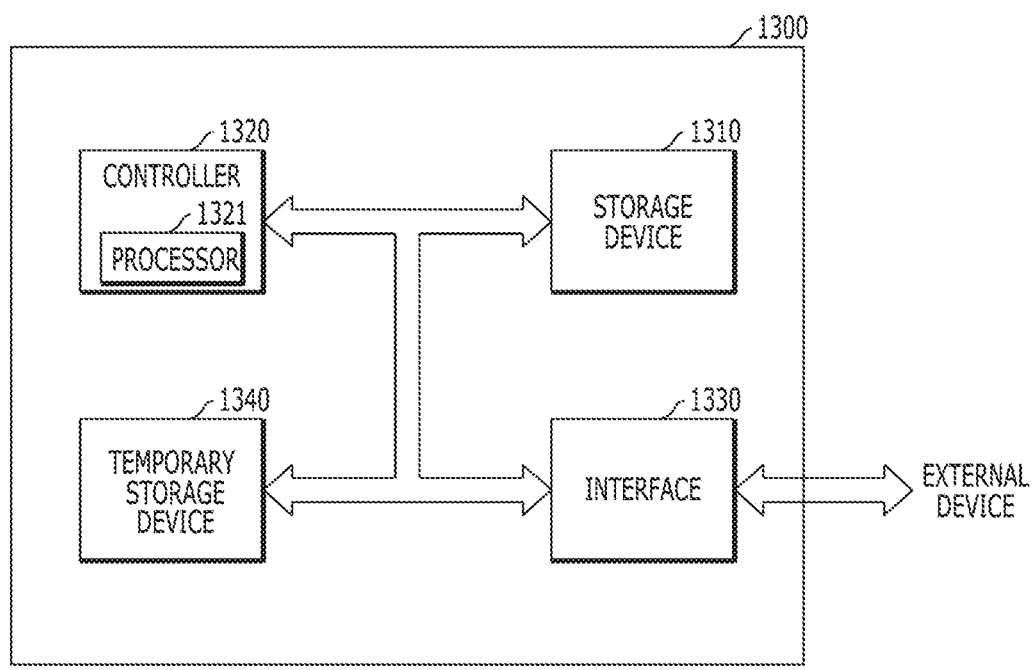
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the storage device 1310 or the temporary storage device 1340 may be improved. As a consequence, operating characteristics and data storage characteristics of the data storage system 1300 may be improved.

Figure 8:
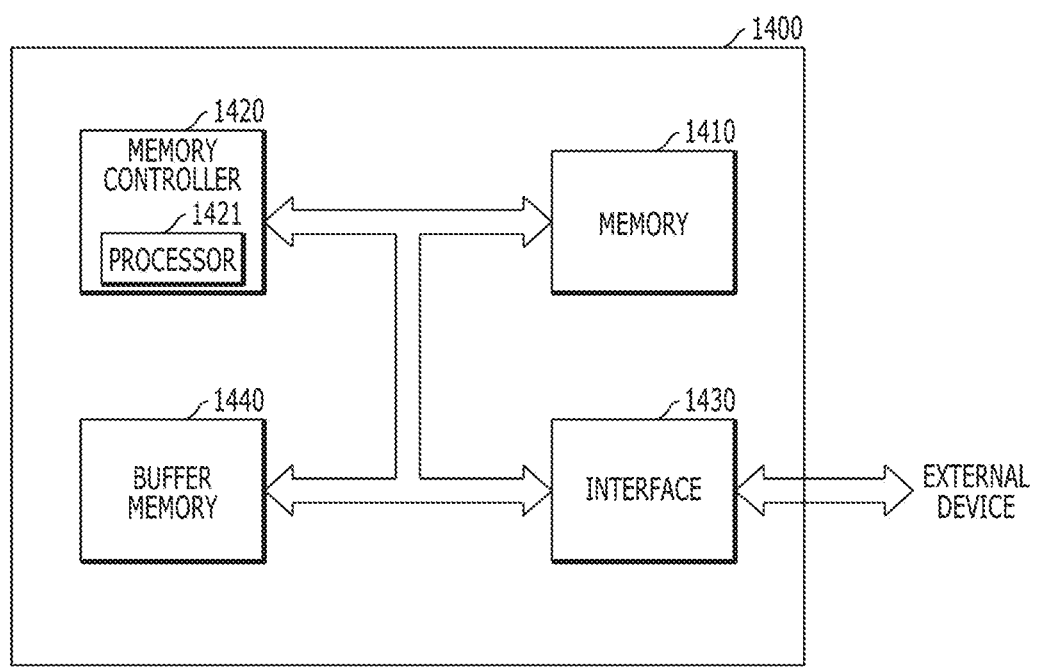
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element that exhibits different resistance states for storing data; and a lower contact plug coupled to the variable resistance element and disposed under the variable resistance element, and wherein a width of the lower contact plug increases from a top surface of the lower contact plug to a bottom surface of the lower contact plug. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

The invention claimed is:

1. A method for fabricating an electronic device including a semiconductor memory, comprising:
    forming a conductive layer over a substrate;
    forming a material layer over the conductive layer;
    forming a variable resistance element by selectively etching the material layer, the selective etching of the material layer causing portions of the conductive layer to be exposed; and
    forming a lower contact plug by etching the exposed conductive layer, the lower contact plug being coupled to the variable resistance element under the variable resistance element,
    wherein the method further comprises, after the forming of the lower contact plug:
    forming an insulating layer covering the lower contact plug and the variable resistance element;
    selectively etching a portion of the insulating layer to form a hole exposing a portion of the substrate and having a width which decreases from a top surface to a bottom surface of the hole, wherein the portion of the insulating layer does not overlap the lower contact plug and the variable resistance element; and
    forming a contact plug by filling the hole with a conductive material.

2. The method of claim 1, wherein the forming of the variable resistance element and the forming of the lower contact plug are performed by a physical etching process.

3. The method of claim 1, wherein a sidewall of the variable resistance element is aligned with a sidewall of the lower contact plug.

4. The method of claim 1, wherein the forming of the material layer comprises:
    forming a first layer that is either a free layer having a variable magnetization direction or a pinned layer having a pinned magnetization direction;
    forming a tunnel barrier layer over the first layer; and
    forming a second layer over the tunnel barrier layer, the second layer being either the free layer or the pinned layer and different from the first layer.

5. The method of claim 4, wherein the forming of the material layer further comprises:
    forming a lower electrode layer over the lower contact plug to include a conductive material different from the lower contact plug, before the forming of the first layer.

6. The method of claim 1, after the forming of the lower contact plug, further comprising:
    forming an insulating layer covering the lower contact plug and the variable resistance element, the insulating layer disposed above the variable resistance element;
    selectively etching the insulating layer to form a hole exposing a top surface of the variable resistance element and having a width which decreases from a top surface to a bottom surface of the hole; and forming an upper contact plug by filling the hole with a conductive material.

7. The method of claim 6, wherein a sidewall of the variable resistance element is not aligned with a sidewall of the upper contact plug.

8. The method of claim 1, after the forming of the variable resistance element, further comprising:
   forming a spacer pattern over a sidewall of the variable resistance element.

9. The method of claim 8, wherein the forming of the spacer pattern comprises:
   forming an insulating material along the variable resistance element and the conductive layer; and
   removing the insulating material which is located over the conductive layer.

10. The method of claim 8, wherein an outer sidewall of the spacer pattern is aligned with a sidewall of the lower contact plug.

11. The method of claim 1, wherein a width of the lower contact plug increases from a top surface of the lower contact plug to a bottom surface of the lower contact plug.

12. The method of claim 11, wherein a width of the variable resistance element increases from a top surface of the variable resistance element to a bottom surface of the variable resistance element.

13. An electronic device comprising a semiconductor memory, wherein the semiconductor memory comprises:
   a substrate including a source region and a drain region;
   stack structures formed over the substrate, each stack structure having a width increasing toward the substrate along a direction perpendicular to a surface of the substrate and including a variable resistance element having a resistance state depending on a voltage or current applied through the variable resistance element and a lower contact plug disposed under the variable resistance element and connecting the variable resistance element to the drain region, wherein the variable resistance element includes a lower electrode, a free layer, a tunnel barrier, a pinned layer and an upper electrode;
   an upper contact plug formed over the stacked structure to connect the variable resistance element to a bit line; and
   a source line contact plug formed over the substrate and connecting the source region to a source,
   wherein sidewalls of the variable resistance element, the lower contact plug, the lower electrode, and the upper electrode are aligned with one another, and
   wherein a sidewall of the upper electrode is not aligned with a sidewall of the upper contact plug.

14. The electronic device of claim 13, wherein the source line contact plug has a width decreasing toward the substrate along a direction perpendicular to the surface of the substrate.

15. The electronic device of claim 13, wherein an upper surface of the lower contact plug is planarized.

16. The electronic device of claim 13, wherein a top surface of the lower contact plug has a width same as that of a lower surface of the variable resistance element.

17. The electronic device of claim 13, wherein the variable resistance element of each stack structure has a sidewall covered by a spacer layer.

18. The electronic device of claim 13, wherein the variable resistance element has a sidewall aligned with a sidewall of the lower contact plug.

* * * * *